(12) United States Patent
Koshiba et al.

(10) Patent No.: US 8,423,926 B2
(45) Date of Patent: Apr. 16, 2013

(54) ACCEPTANCE DETERMINING METHOD OF BLANK FOR EUV MASK AND MANUFACTURING METHOD OF EUV MASK

(75) Inventors: Takeshi Koshiba, Mie-ken (JP); Hidefumi Mukai, Mie-ken (JP); Seiro Miyoshi, Kanagawa-ken (JP); Kazunori Iida, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,790

(22) Filed: Sep. 20, 2011

(65) Prior Publication Data

US 2012/0174045 A1 Jul. 5, 2012

(30) Foreign Application Priority Data

Jan. 4, 2011 (JP) ................................. 2011-000100

(51) Int. Cl.
*G06F 17/50* (2006.01)
(52) U.S. Cl.
USPC ................... 716/54; 716/50; 716/51; 716/52; 716/53; 716/55
(58) Field of Classification Search ............... 716/50, 716/51, 52, 53, 54, 55
See application file for complete search history.

(56) References Cited

U.S. PATENT DOCUMENTS

| 6,765,673 | B1 * | 7/2004 | Higashikawa ................ 356/399 |
| 7,005,649 | B1 | 2/2006 | Tezuka et al. | |
| 2011/0161893 | A1 * | 6/2011 | Lin et al. ........................ 716/52 |

FOREIGN PATENT DOCUMENTS

| JP | 11-354404 | 12/1999 |
| JP | 2001-33941 | 2/2001 |
| JP | 2009-10373 | 1/2009 |
| JP | 2010-34600 | 2/2010 |

OTHER PUBLICATIONS

Notification of Comments, issued by Korean Patent Office, mailed Dec. 7, 2012, in Korean Patent App. No. 10-2011-90602 (8 pages including English translation).

* cited by examiner

*Primary Examiner* — Thuan Do
*Assistant Examiner* — Brian Ngo
(74) *Attorney, Agent, or Firm* — Finnegan, Henderson, Farabow, Garrett & Dunner, L.L.P.

(57) ABSTRACT

According to one embodiment, an acceptance determining method of a blank for an EUV mask includes evaluating whether or not an integrated circuit device becomes defective, on the basis of information of a defect contained in a blank for an EUV mask and design information of a mask pattern to be formed on the blank. The integrated circuit device is to be manufactured by using the EUV mask. The EUV mask is manufactured by forming the mask pattern on the blank. And the blank is determined to be non-defective in a case that the integrated circuit device is not to be defective.

16 Claims, 10 Drawing Sheets

DEFECTIVE
BLANK
EUV MASK
INTEGRATED CIRCUIT DEVICE

NON-DEFECTIVE
BLANK
EUV MASK
INTEGRATED CIRCUIT DEVICE

ACCEPTANCE DETERMINING METHOD OF BLANK FOR EUV MASK AND MANUFACTURING METHOD OF EUV MASK

CROSS-REFERENCE TO RELATED APPLICATIONS

This application is based upon and claims the benefit of priority from the prior Japanese Patent Application No. 2011-000100, filed on Jan. 4, 2011, the entire contents of which are incorporated herein by reference.

FIELD

Embodiments described herein relate generally to an acceptance determining method of a blank for EUV mask and a manufacturing method of an EUV mask.

BACKGROUND

In order to manufacture an integrated circuit device in which a large number of semiconductor elements such as a transistor are provided, techniques for shrinking patterns are indispensable for improvement of integration. Recently, in order to further shrink patterns, various lithography techniques have been developed actively. One of such lithography techniques is an exposure technique using EUV light as exposure light. The wavelength of the EUV light used as exposure light is as extremely short as approximately 13.5 nm. Thus, the EUV lithography technique is considered as a lithography technique that resolves extremely fine patterns having the size of 50 nm or less.

Since a material that transmits the EUV light having such a wavelength is difficult to obtain, an exposure optical system of an EUV exposing apparatus is not a transmissive optical system but a reflective optical system. Also, an EUV mask for EUV exposure is not a transmissive mask but a reflective mask. The EUV mask is manufactured by forming a mask pattern on a blank. The mask pattern is formed selectively an absorption film which absorbs EUV light. The blank has a reflection film for EUV light made of a multilayer film provided on a substrate.

In this type of the EUV lithography technique, the blank for EUV mask itself is a structural body having a fine structure and moreover, the wavelength of the EUV light is extremely short, and thus, a defect caused by the blank might appear in an exposed image. Therefore, in order to improve yield of the EUV lithography, it is preferable that a blank is inspected before a mask pattern is formed so that only a blank without a defect is used. However, since it is difficult to completely eliminate a defect in the blank, if only blanks without a defect are to be used, the yield of the blank is lowered, and a manufacturing cost of the EUV mask is increased, which is a problem.

DETAILED DESCRIPTION

In general, according to one embodiment, an acceptance determining method of a blank for an EUV mask includes evaluating whether or not an integrated circuit device becomes defective, on the basis of information of a defect contained in a blank for an EUV mask and design information of a mask pattern to be formed on the blank. The integrated circuit device is to be manufactured by using the EUV mask. The EUV mask is manufactured by forming the mask pattern on the blank. And the blank is determined to be non-defective in a case that the integrated circuit device is not to be defective.

An embodiment of the invention will be described below by referring to the attached drawings.

The embodiment is an embodiment of an acceptance determining method of a blank for EUV mask and a manufacturing method of an EUV mask.

First, in an acceptance determining method of a blank for EUV mask according to the embodiment, the blank for EUV mask to be determined will be described.

Figure 1:
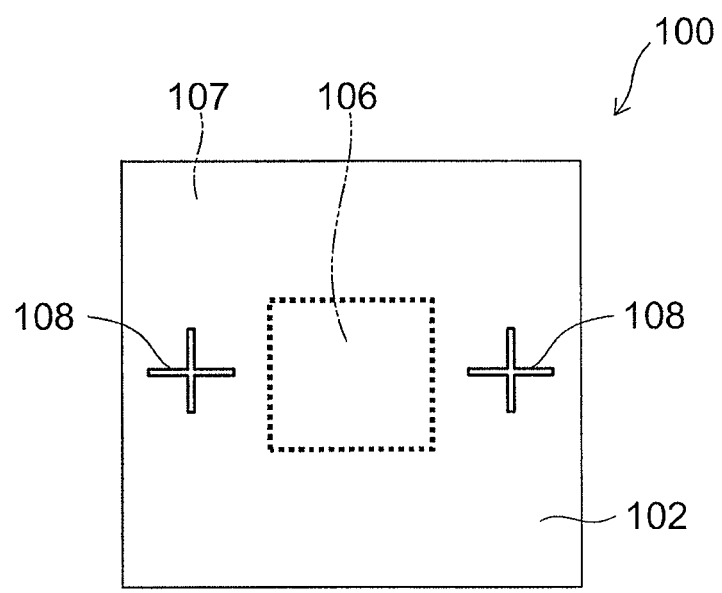
FIG. 1 is a plan view showing a blank for EUV mask which is an object of an acceptance determining method according to an embodiment.
Figure 2:
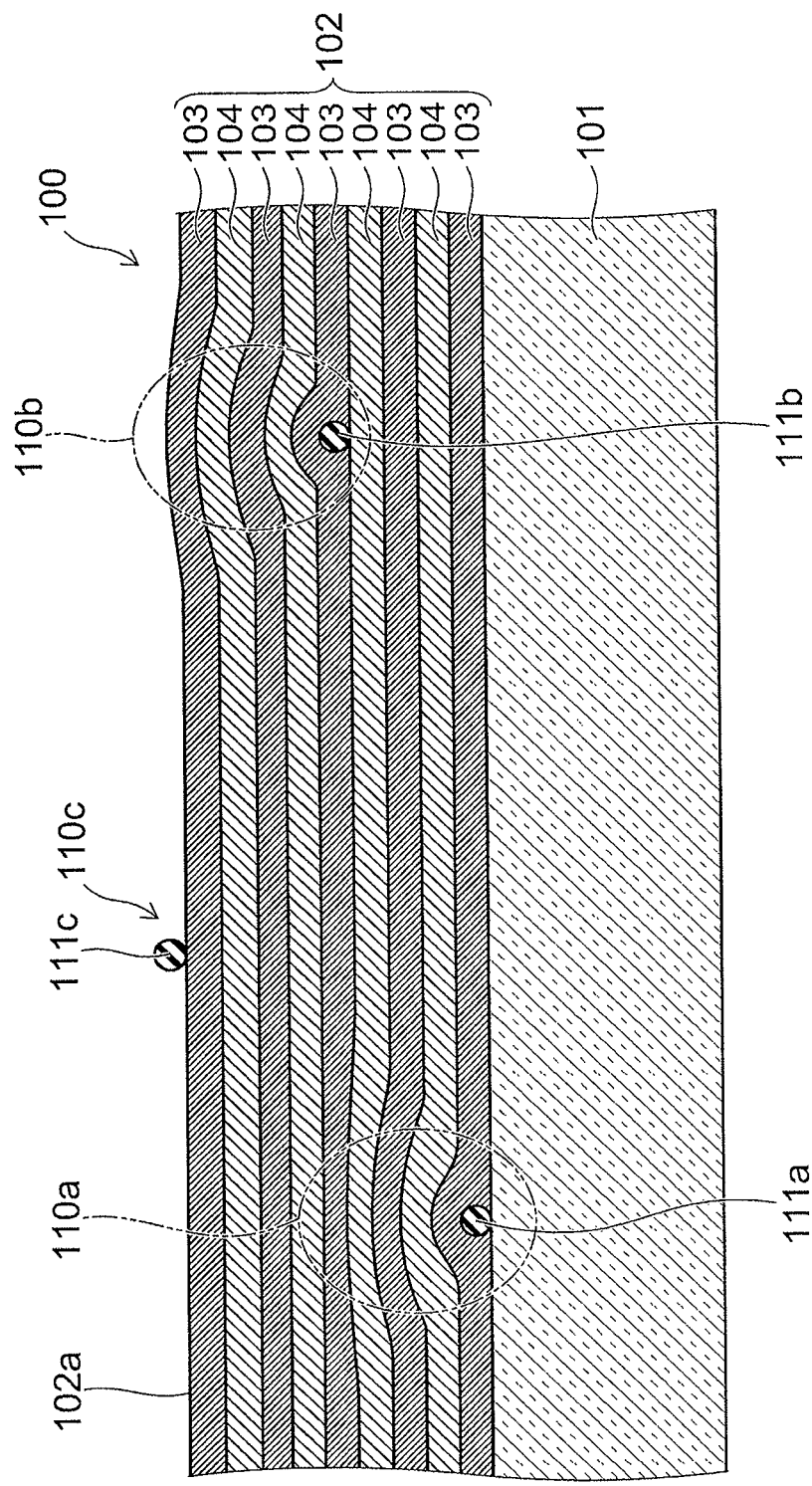
FIG. 2 is a cross-sectional view showing the blank for EUV mask which is an object of the acceptance determining method according to the embodiment.

FIG. 1 is a plan view showing a blank for EUV mask which is an object of the acceptance determining method according to the embodiment, and FIG. 2 is a cross-sectional view showing the blank for EUV mask which is an object of the acceptance determining method according to the embodiment.

As shown in FIGS. 1 and 2, in a blank for EUV mask (hereinafter referred simply as a "blank") 100 which is an object of the acceptance determining method according to the embodiment, a quartz substrate 101 is provided. The quartz substrate 101 has a substantially rectangular-solid plate shape. On the quartz substrate 101, a multilayer film 102 is provided. In the multilayer film 102, a molybdenum (Mo) layer 103 and a silicon (Si) layer 104 are alternately laminated in several tens of layers. The multilayer film 102 functions as a reflection film for EUV light. In FIG. 2, the number of laminations of the molybdenum layer 103 and the silicon layer 104 is expressed smaller than actuality for convenience of Illustration.

When seen from the above, the shape of the blank 100 is a rectangle, and a mask pattern formation region 106 is set at the center part The mask pattern formation region 106 is a region where an absorption film which absorbs EUV light is selectively provided on the multilayer film 102, and a mask pattern 210 (See FIG. 11) is formed when the EUV mask is to be manufactured by using the blank 100. On the other hand, a periphery part of the blank 100, that is, a frame-shaped region surrounding the mask pattern formation region 106 is a peripheral region 107. At two regions sandwiching the mask pattern formation region 106 in the peripheral region 107, position-referring marks 108 are formed. As will be described later, by forming the mask pattern 210 (See FIG. 11) on the mask pattern formation region 106 of the blank 100, the EUV mask 200 (See FIG. 11) is manufactured. Also, by performing EUV exposure by using this EUV mask 200, an integrated circuit device 300 (See FIG. 7) such as a memory device is manufactured. In the embodiment, the integrated circuit device 300 is assumed to be a device having a redundancy circuit.

In the blank 100, a defect is likely to have been generated. In FIG. 2, defects 110a, 110b, and 110c of the blank 100 are schematically illustrated.

In the defect 110a, a particle 111a is interposed between the quartz substrate 101 and the multilayer film 102. As a result, in the molybdenum layer 103 and the silicon layer 104 laminated in the lower part of the multilayer film 102, a portion located immediately above the particle 111a and the periphery thereof are raised. Thus, the portions immediately above the particle 111a and the periphery thereof in the lower part of the multilayer film 102 has the laminated film thicknesses of the molybdenum layer 103 and the silicon layer 104 varied with respect to the other portions in the multilayer film 102. However, the degree of raising of the molybdenum layer 103 and the silicon layer 104 becomes smaller as it gets closer to an upper face 102a of the multilayer film 102, and the upper face 102a is not substantially raised.

In the defect 110b, a particle 111b is present inside the multilayer film 102. As a result, in a portion in a layer higher than the particle 111b in the multilayer film 102, the molybdenum layer 103 and the silicon layer 104 are raised. The degree of raising also becomes smaller as it gets closer to the upper face 102a of the multilayer film 102, but the raising does not disappear completely even on the upper face 102a but the portion immediately above the particle 111b and the periphery thereof on the upper face 102a are raised with respect to the other regions. As a result, in the portion above the particle 111b in the multilayer film 102, in the portion immediately above the particle 111b and the periphery thereof, reflectivity of the EUV light is locally changed with respect to the other portions in the multilayer film 102.

In the defect 110c, a particle 111c adheres to the upper face 102a of the multilayer film 102. In a portion immediately below the particle 111c in the multilayer film 102, no defect is present in the lamination structure of the molybdenum layer 103 and the silicon layer 104. The particles 111a, 111b, and 111c are particles that had been present in the atmosphere which mixed in during film formation of the multilayer film 102, for example.

With regard to the defect 110a, the raised part reflecting the shape of the particle 111a is not formed on the upper face 102a of the multilayer film 102, and it does not cause an obstacle in forming a mask pattern on the multilayer film 102. Thus, the defect 110a does not cause a defect in a mask pattern (hereinafter referred to as a "pattern defect"). However, in the defect 110a, since the thicknesses of the molybdenum layer 103 and the silicon layer 104 are varied, in reflection light when the multilayer film 102 is irradiated with the EUV light, a phase difference involved with the local fluctuation of the reflectivity of the EUV light is generated between the portion corresponding to the defect 110a and the periphery thereof. For example, assuming that the EUV light has the wavelength of 13.5 nm and an incident angle when the EUV light enters the mask is 5.8 degrees, with a shift of the lamination film thickness only by approximately 3.5 nm, a phase difference of $\pi$ is generated As a result, strength of the portion corresponding to the defect 110a in the reflection light is extremely lowered, which becomes a dark part. Such a defect is called a "phase defect".

With regard to the defect 110b, since the upper face 102a of the multilayer film 102 is raised by reflecting the shape of the particle 111b, it makes an obstacle when a mask pattern is formed. That is, it can cause a pattern defect. In the following, a defect in the blank that can cause a pattern defect when a mask pattern is formed as above will be referred to as a "pattern disturbing defect." Also, in the defect 110b, since the lamination film thickness is varied, the defect 110b is also a phase defect.

With regard to the defect 110c, since the lamination film thickness is not varied, this is not a phase defect. However, since the particle 111c adhering to the upper face 102a of the multilayer film 102 becomes an obstacle when a mask pattern is formed, it can cause a pattern defect. Therefore, the defect 110c is a pattern disturbing defect.

As described above, one or more types of defects might have occurred in the blank 100. Such defects are detected by inspecting the blank 100 For example, by emitting light for inspection to the blank 100, by measuring intensity of the reflection light, and by preparing a spatial profile, defects in the blank 100 can be detected. For example, by conducting an inspection using visible light as the light for inspection, irregularity on the upper face 102a of the multilayer film 102 can be detected, and a pattern disturbing defect can be detected. Also, by conducting an inspection using an ultraviolet ray other than the EUV light (extreme ultraviolet ray) as the light for inspection, a pattern disturbing defect and a part of phase defects can be detected. Moreover, by conducting an inspection using the EUV light as the light for inspection, a pattern disturbing defect and a phase defect can be detected substantially reliably. A detection result of the defects becomes "defect information" of the blank 100. The defect information is primary data such as a spatial profile of the intensity of the reflection light or a spatial profile of contrast obtained by removing a background from the intensity of the reflection light and the like, for example, or secondary data such as a position, size and the like of each defect calculated from the primary data. Coordinates of the data can be outputted by using the position referring marks 108 as references.

Subsequently, a method of determining acceptance of the blank for EUV mask according to the embodiment will be described.

The method of determining acceptance of the blank for EUV mask according to the embodiment is a method of determining whether the blank 100 is "non-defective" or "defective".

Figure 3:
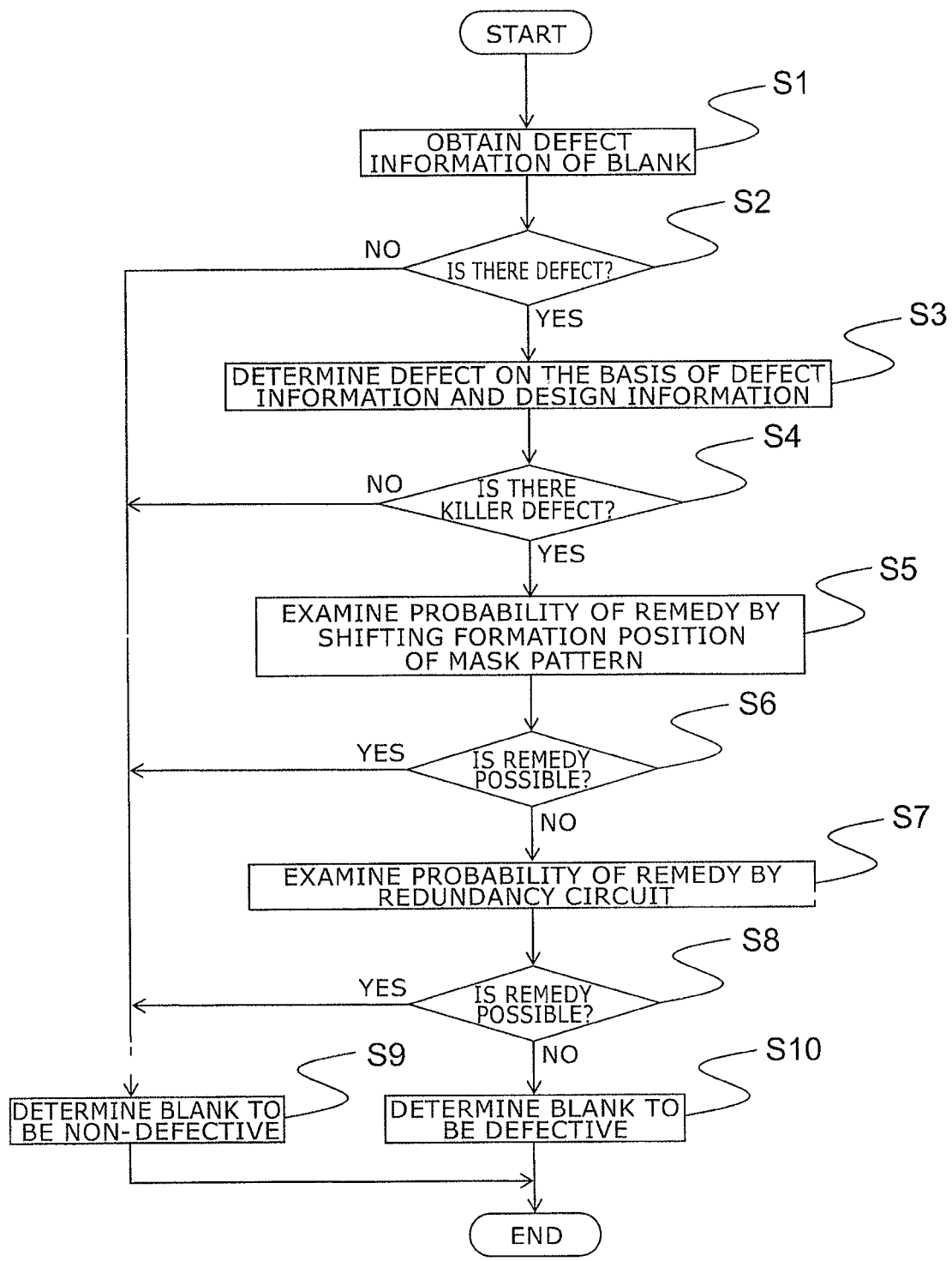
FIG. 3 is a flowchart showing a method of determining acceptance of the blank for EUV mask according to the embodiment.
Figure 4A:
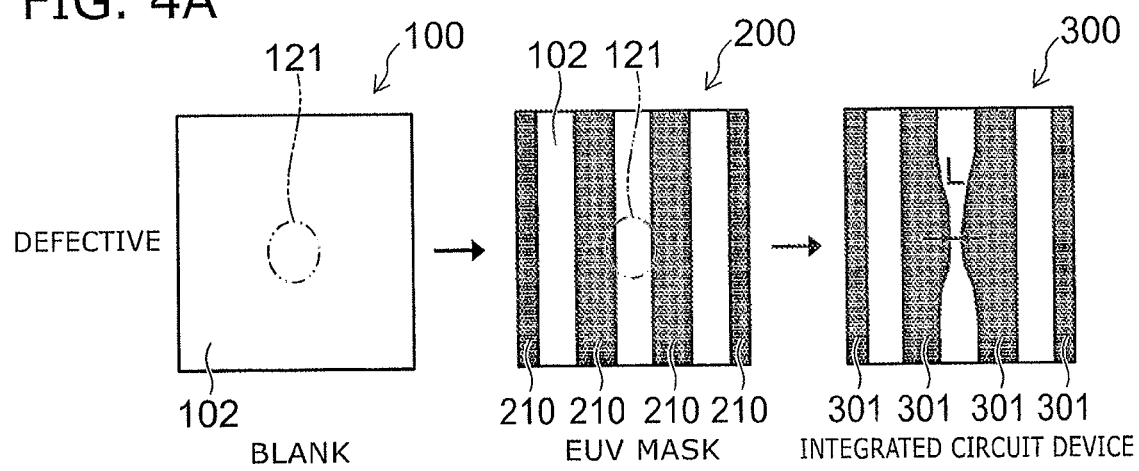
FIGS. 4A and 4B are diagrams showing an effect of a phase defect of the blank on acceptance of an integrated circuit device.
Figure 4B:
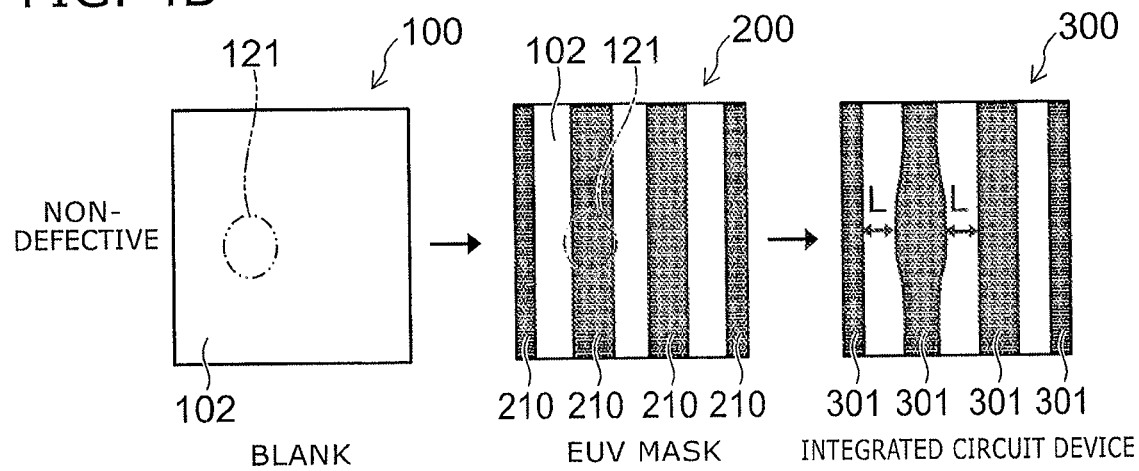
Figure 5A:
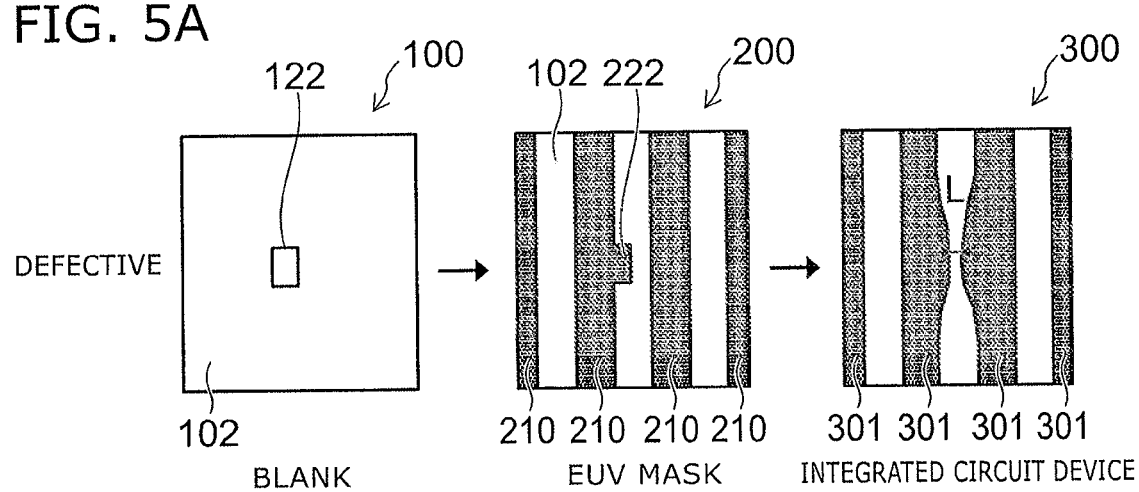
FIGS. 5A and 5B are diagrams showing an effect of a pattern disturbing defect of the blank on acceptance of the integrated circuit device.
Figure 5B:
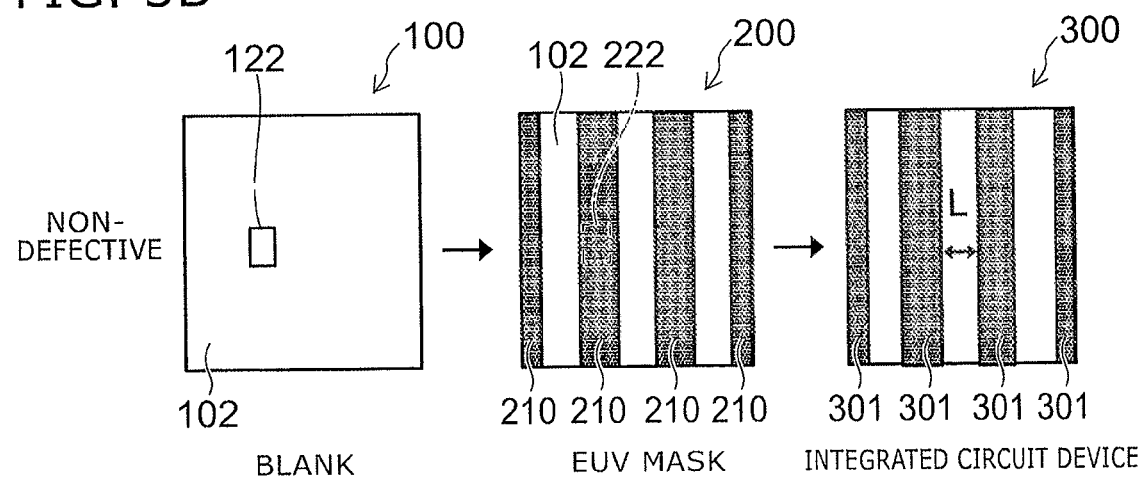
Figure 6A:
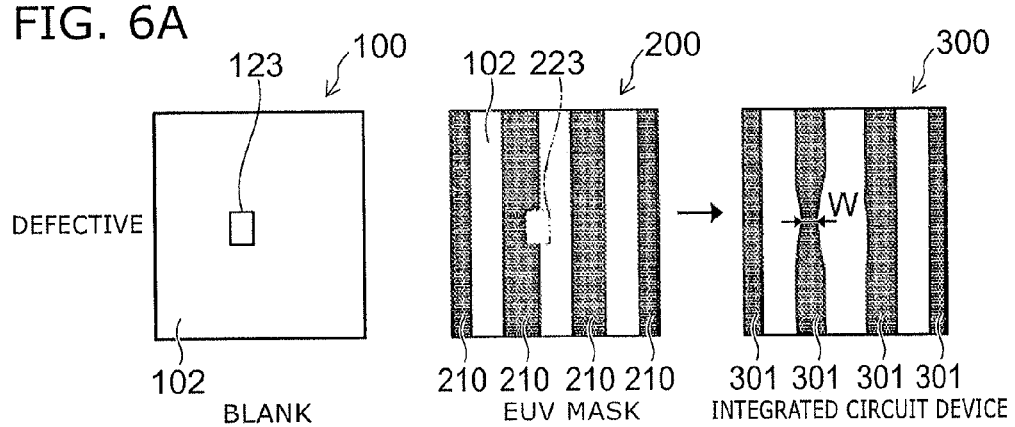
FIGS. 6A and 6B are diagrams showing an effect of a pattern disturbing defect of the blank on acceptance of the integrated circuit device.
Figure 6B:
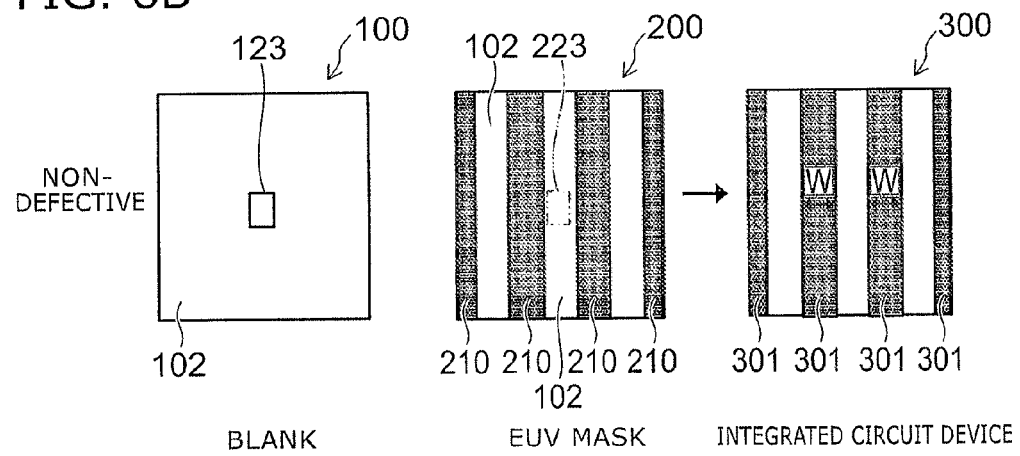
Figure 7:
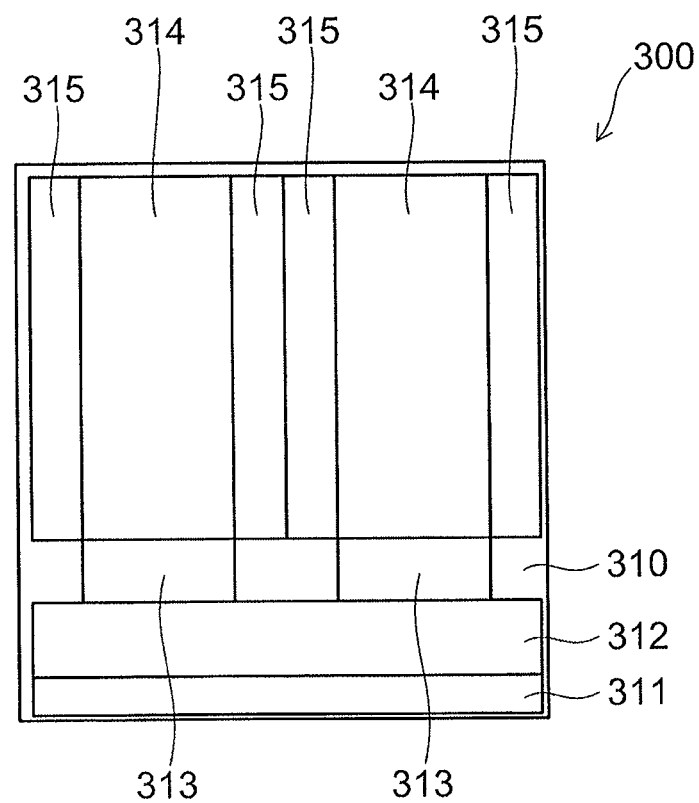
FIG. 7 is a plan view showing the integrated circuit device having a redundancy circuit.
Figure 7:
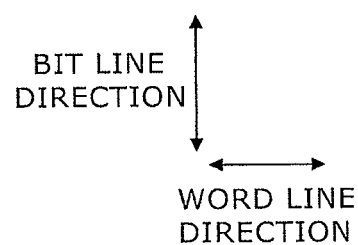
Figure 8:
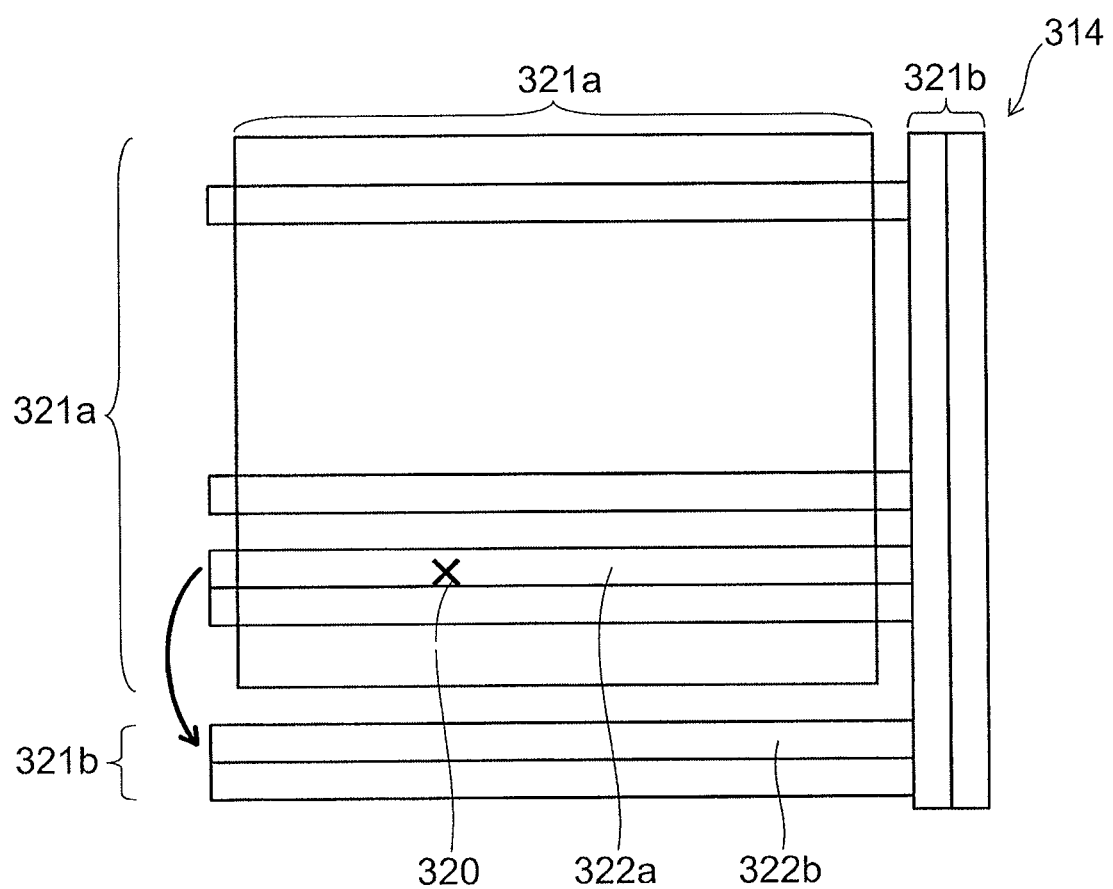
FIG. 8 is a plan view showing the redundancy circuit of the integrated circuit device.
Figure 9:
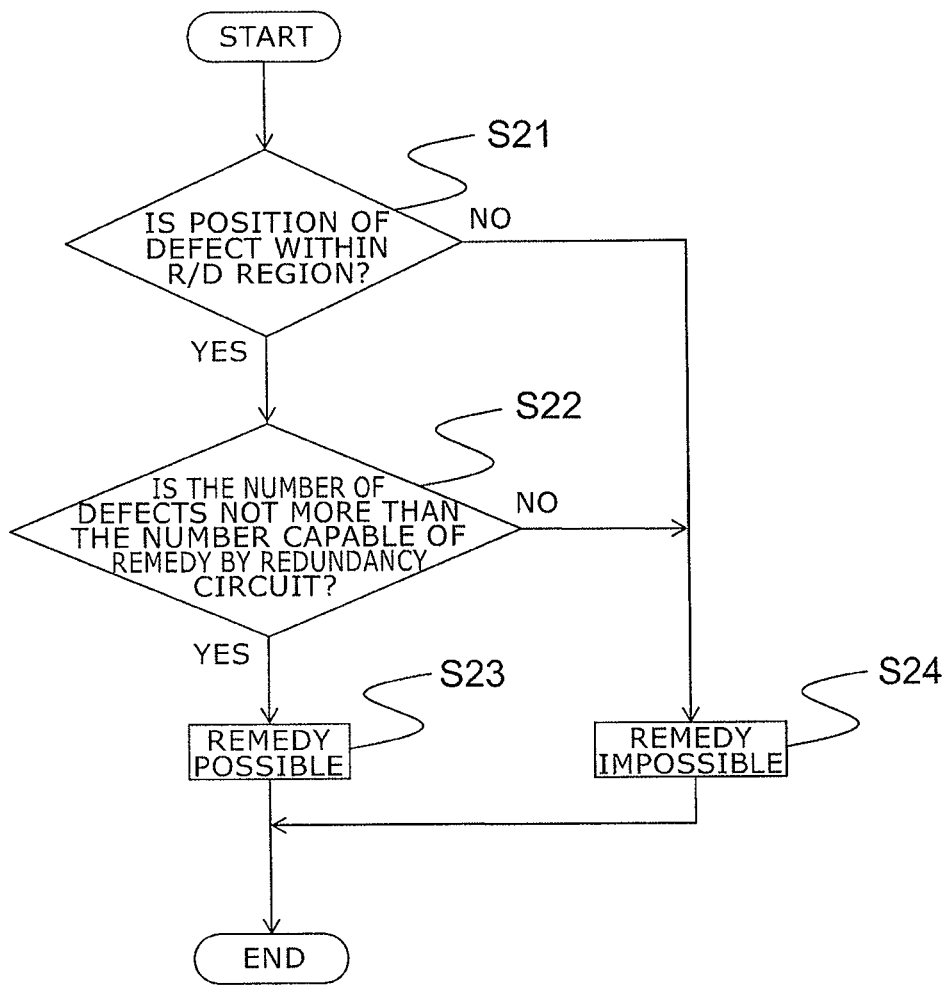
FIG. 9 is a flowchart showing a method of determining whether or not a remedy by the redundancy circuit is possible.

FIG. 3 is a flowchart showing a method of determining acceptance of the blank for EUV mask according to the embodiment, FIGS. 4A and 4B are diagrams showing an effect of a phase defect of the blank on acceptance of an integrated circuit device, FIGS. 5A and 5B are diagrams showing an effect of a pattern disturbing defect of the blank on acceptance of the integrated circuit device, FIGS. 6A and 6B are diagrams showing an effect of a pattern disturbing defect of the blank on acceptance of the integrated circuit device, FIG. 7 is a plan view showing the integrated circuit device having a redundancy circuit, FIG. 8 is a plan view showing the redundancy circuit of the integrated circuit device, and FIG. 9 is a flowchart showing a method of determining whether or not a remedy by the redundancy circuit is possible.

First, as illustrated at Step S1 in FIG. 3, defect information on the blank 100 to be determined is obtained.

Subsequently, as illustrated at step S2, the obtained defect information is referred to, and it is checked whether or not a defect is present in this blank 100. If a defect is not present, the routine proceeds to Step S9, and it is determined that this blank 100 is "non-defective". On the other hand, if there is a defect, the routine proceeds to Step S3, and more detailed evaluation is made on the defect.

At Step S3, on the basis of the defect information of the defect contained in the blank 100 and design information of a mask pattern to be formed on this blank 100, it is determined whether this defect is a "killer defect" or not. The design information of the mask pattern is information on the shape of an absorption film to be selectively formed on the blank 100 or information corresponding to a layout and a dimension or the like of wiring of the integrated circuit device 300 to be manufactured, for example. The killer defect is a defect which would make this integrated circuit device defective due to the presence of this defect when the EUV mask is fabricated by forming a mask pattern on this blank 100 and the integrated circuit device is manufactured by using this EUV mask.

Whether or not the defect present in the blank 100 is a killer defect can be determined by simulating an effect of the defect in the blank 100 on the exposed image obtained by irradiating the EUV mask with the EUV light on the basis of the design information of the mask pattern, the lamination structure of the EUV mask, and the exposure conditions of the EUV exposure, for example. The lamination structure of the EUV mask refers to, as illustrated in FIG. 2, the material, thickness, the number of laminations of each layer forming the multilayer film 102 and the like. The exposure conditions of the EUV exposure include parameters indicating characteristics of each material forming the EUV mask, the wavelength of the exposure light (EUV light), illumination conditions, numerical aperture (NA) of the projection optical system, the exposure amount, focus, flare amount, incident angle of the EUV light, and diffusion coefficient of the resist material and the like. The exposed image is a projected image formed on an exposure object such as a resist film, for example.

FIGS. 4A, 4B, 5A, 5B, 6A, and 6B illustrate the blank 100 containing a defect, the EUV mask 200 manufactured by forming a mask pattern on this blank 100, and the integrated circuit device 300 manufactured by using this EUV mask 200 in the order from the left side in the figure, respectively. Also, FIGS. 4A, 5A, and 6A illustrate cases in which the integrated circuit device 300 is defective, and FIGS. 4B, 5B, and 6B illustrate cases in which the integrated circuit device 300 is non-defective, respectively.

For example, as illustrated in FIGS. 4A and 4B, assume that there is a phase defect 121 in the blank 100. At this time, even in the EUV mask 200 manufactured using this blank 100, the phase defect 121 is present. Also, in the EUV mask 200, the mask pattern 210 is formed. The mask pattern 210 is a region where the EUV light is absorbed. By using this EUV mask 200, EUV exposure is performed, and the integrated circuit device 300 is manufactured. At this time, in the region to which the mask pattern 210 in the integrated circuit device 300 was transferred, wiring 301 is assumed to be formed. Also, the phase defect 121 of the EUV mask 200 becomes a dark part in the exposed image and acts so that the wiring 301 is expanded.

As illustrated in FIG. 4A, if a distance L between the wirings 301 of the integrated circuit device 300 becomes less than an allowable value due to the phase defect 121 of the EUV mask 200, the integrated circuit device 300 is determined to be defective. In this case, the phase defect 121 of the blank 100 is a killer defect. If the distance L becomes zero, the wirings 301 are short-circuited with each other. In this case, too, the integrated circuit device 300 is determined as defective, and thus, the phase defect 121 is a killer defect.

On the other hand, as illustrated in FIG. 4B, in the mask 200, for example, if the phase defect 121 is overlapped with the mask pattern 210 and the distance L between the wirings 301 does not become less than the allowable value due to the phase defect 121, the integrated circuit device 300 is determined to be non-defective. In this case, the phase defect 121 of the blank 100 is not a killer defect.

Also, as illustrated in FIGS. 5A and 5B, consider a case in which a pattern disturbing defect 122 is present in the blank 100. At this time, in the EUV mask 200 manufactured by using this blank 100, since the pattern disturbing defect 122 of the blank 100 disturbs formation of the mask pattern, a pattern defect 222 occurs. This pattern defect 222 is assumed to be a non-transparent defect which shuts out the EUV light.

Then, as illustrated in FIG. 5A, in the integrated circuit device 300, if the distance L between the wirings 301 becomes less than the allowable value due to the pattern defect 222 of the EUV mask 200, the integrated circuit device 300 is determined to be defective. In this case, the pattern disturbing defect 122 of the blank 100 is a killer defect. If the distance L becomes zero, the wirings 301 are short-circuited with each other and the integrated circuit device 300 is determined as defective, and thus, the pattern disturbing defect 122 is a killer defect.

On the other hand, as illustrated in FIG. 5B, in the mask 200, for example, if the pattern defect 222 is overlapped with the mask pattern 210 and the distance L between the wirings 301 does not become less than the allowable value due to the pattern defect 222, the integrated circuit device 300 is determined to be non-defective. In this case, the pattern disturbing defect 122 of the blank 100 is not a killer defect.

Moreover, as illustrated in FIGS. 6A and 6B, consider a case in which a pattern disturbing defect 123 is present in the blank 100. At this time, in the EUV mask 200 manufactured by using this blank 100, since the pattern disturbing defect 123 of the blank 100 disturbs formation of the mask pattern, a pattern defect 223 occurs. This pattern defect 223 is assumed to be a transparent defect which transmits the EUV light.

Then, as illustrated in FIG. 6A, in the integrated circuit device 300, if a width W of the wiring 301 becomes less than an allowable value due to the pattern defect 223 of the EUV mask 200, the integrated circuit device 300 is determined to be defective. In this case, the pattern disturbing defect 123 of the blank 100 is a killer defect. If the width W becomes zero, the wiring 301 becomes open, and the integrated circuit device 300 is determined as defective, and thus, the pattern disturbing defect 123 is a killer defect.

On the other hand, as illustrated in FIG. 6B, for example, in the mask 200, the pattern defect 223 is overlapped with a reflection region between the mask patterns 210, that is, a region where the multilayer film 102 is exposed, and if the width W of the wiring 301 does not become less than the allowable value due to the pattern defect 223, the integrated circuit device 300 is determined to be non-defective In this case, the pattern disturbing defect 123 of the blank 100 is not a killer defect.

As described above, at Step S3, it is determined whether or not each defect having occurred in the blank 100 is a killer defect. As illustrated at Step S4, if it is not that all the defects present in the blank 100 are killer defects but there is no killer defect in the blank 100, that is, if the integrated circuit device 300 does not become defective due to the defect of the blank 100, the routine proceeds to Step S9, and this blank 100 is determined to be "non-defective". On the other hand, if the integrated circuit device 300 becomes defective due to the defect in the blank 100, that is, if there is one or more killer defects in the blank 100, the routine proceeds to Step S5, and probability to remedy this blank 100 is examined.

At Step S5, with regard to the blank 100 determined at Step S4 to make the integrated circuit device 300 defective, whether or not the remedy of this blank 100 is possible by shifting a formation position of the mask pattern with respect to the blank 100 is examined. Specifically, by shifting the formation position of the mask pattern on the basis of the design information of the mask pattern, it is determined whether or not the integrated circuit device 300 is non-defective.

For example, the blank 100 illustrated in FIGS. 4A, 5A or 6A is a blank containing a killer defect. As described above, even if this EUV mask 200 is manufactured by using this blank 100 and the integrated circuit device 300 is manufactured by using this EUV mask 200 as it is, the integrated circuit device 300 becomes defective. However, by shifting the formation position of the mask pattern with respect to the blank 100, in the EUV mask 200 to be manufactured, a relative positional relationship between the defect and the mask pattern 210 is changed. As a result, as the blank 100 illustrated in FIGS. 4B, 5B or 6B, the defect is no longer a killer defect, and it is likely that the integrated circuit device 300 becomes non-defective.

Then, as illustrated at Step S6, by shifting the formation position of the mask pattern with respect to the blank 100, if the integrated circuit device 300 is non-defective, that is, if it is possible to remedy the blank 100, the routine proceeds to Step S9, and this blank 100 is determined as "non-defective." On the other hand, if the integrated circuit device 300 does not become non-defective by shifting the formation position of the mask pattern and the blank 100 cannot be remedied, the routine proceeds to Step S7, and probability of remedy of the blank 100 by another method is further examined.

At Step S7, with regard to the blank 100 determined at Step S6 that it cannot be remedied by shifting the formation position of the mask pattern, probability of remedy by the redundancy circuit of the integrated circuit device 300 is examined. The method of this examination will be described below in detail by citing a specific example of the integrated circuit device 300.

First, a specific example of the integrated circuit device 300 having a redundancy circuit will be described.

As illustrated in FIG. 7, the integrated circuit device 300 is a semiconductor memory device, for example. In the integrated circuit device 300, a semiconductor substrate 310 is provided. Also, as two directions in parallel with the upper face of the semiconductor substrate 310 and orthogonal to each other, a word line direction and a bit line direction are set. A pad region 311 is provided at one end portion in the bit line direction of the integrated circuit device 300, and a peripheral circuit region 312 is provided adjacent to that. Also, further adjacent to the peripheral circuit region 312, a plurality of sense amplifier regions 313 are provided, and further adjacent to each of the sense amplifier regions 313, a memory cell region 314 is provided. That is, the pad region 311, the peripheral circuit region 312, the sense amplifier region 313, and the memory cell region 314 are arranged in this order along the bit line direction. Moreover, on both sides in the word line direction of each memory cell region 314, row decoder regions 315 are provided. That is, the memory cell regions 314 and the row decoder regions 315 are arranged along the word line direction.

Among them, the memory cell region 314 is a region in which a plurality of memory cells as basic units are integrated and the memory cells are compatible with each other. Thus, in addition to the memory cells to be used originally, spare memory cells are provided as a redundancy circuit, and if nonconformity occurs in the memory cells to be originally used, the spare memory cells can replace them. Therefore, the memory cell region 314 is a region where remedy by the redundancy circuit is possible. Such a region in which remedy by the redundancy circuit is possible will be referred to as an "R/D region" below.

Specifically, as illustrated in FIG. 8, in the memory cell region 314, a memory cell group 321a to be originally used and a spare memory cell group 321b as a redundancy circuit are provided. If a defect 320 occurs in the memory cell belonging to the memory cell group 321a, use of an entire memory cell row 322a to which this memory cell belongs is prohibited, and instead, a memory cell row 322b provided in the memory cell group 321b is used. As a result, the integrated circuit device 300 is remedied.

Also, since the row decoder region 315 is also a region in which a plurality of compatible basic units are integrated, it is an R/D region in which remedy by the redundancy circuit is possible. On the other hand, a redundancy circuit is not provided on the pad region 311, the peripheral circuit region 312, and the sense amplifier region 313, and thus, they are regions in which remedy by the redundancy circuit is not possible. That is, these regions are not the R/D regions.

Subsequently, with regard to such integrated circuit device 300, a method of determining whether or not the remedy by the redundancy circuit is possible will be described.

First, as illustrated at Step S21 in FIG. 9, in the integrated circuit device 300, it is determined whether or not a position where a defect in the blank 100 is transferred is within an R/D region. In an example illustrated in FIG. 7, it is determined whether the position of the defect is within the memory cell region 314 or within the row decoder region 315. If all the defects caused by the defect in the blank 100 are within the R/D region, that is, within the memory cell region 314 or within the row decoder region 315, the routine proceeds to Step S22. On the other hand, if only one defect caused by the defect in the blank 100 is determined to be outside the R/D region or it is determined to be a killer defect within the peripheral circuit region 312 or within the sense amplifier region 313, for example, the routine goes to Step S24, and it is determined that remedy of the integrated circuit device 300 by the redundancy circuit is not possible.

At Step S22, it is determined whether or not the number of the defects transferred into the R/D region is not more than the number capable of being remedied by the redundancy circuit. Even the integrated circuit device 300 having the redundancy circuit has an upper limit on the number of defects that can be remedied by the redundancy circuit. For example, in the example illustrated in FIG. 8, since the number of the memory cell rows belonging to the memory cell group 321b, which is a redundancy circuit, is limited, the number of defects that can be remedied by applying the redundancy circuit is also limited. However, the upper limit of the number of defects that can be remedied depends not only on the size of the memory cell group 321b but also on the arrangement of the defects. If the number of defects transferred into the R/D region is not more than the number that can be remedied by the redundancy circuit, the routine proceeds to Step S23, and it is determined that the integrated circuit device 300 can be remedied by the redundancy circuit. On the other hand, if the number of defects transferred into the R/D region is larger than the number that can be remedied by the redundancy circuit, the routine proceeds to Step S24, and it is determined that the integrated circuit device 300 cannot be remedied by the redundancy circuit.

As described above, at Step S7 illustrated in FIG. 3, if the position where the defect of the blank 100 in the integrated circuit device 300 is transferred is within the R/D region and also, the number of defects is not more than the number that can be remedied, it is determined that the integrated circuit device 300 can be remedied. Whether or not an arbitrary position in the integrated circuit device 300 is within the R/D region can be read out of the design information of the mask pattern, Also, the number of defects that can be remedied by the redundancy circuit can be read out of the design information of the mask pattern.

Then, as illustrated at Step S8 in FIG. 3, if the integrated circuit device 300 can be remedied by using the redundancy circuit, the routine proceeds to Step S9, and this blank 100 is determined to be "non-defective". On the other hand, if the integrated circuit device 300 cannot be remedied even by using the redundancy circuit, the routine proceeds to Step S10, and this blank 100 is determined to be "defective".

That is, in the embodiment, if a defect is present in the blank 100 (Step S2), this defect is a killer defect (Step S4), it cannot be remedied by shifting the formation position of the mask pattern (Step S6), and it cannot be remedied even by using the redundancy circuit of the integrated circuit device (Step S8), this blank 100 is determined as "defective" (Step S10), while in the other cases, the blank is determined as "non-defective" (Step S9). By evaluating whether or not an integrated circuit to be manufactured is to be defective, acceptance of the blank 100 is determined.

Subsequently, a manufacturing method of the EUV mask according to the embodiment will be described.

Figure 10:
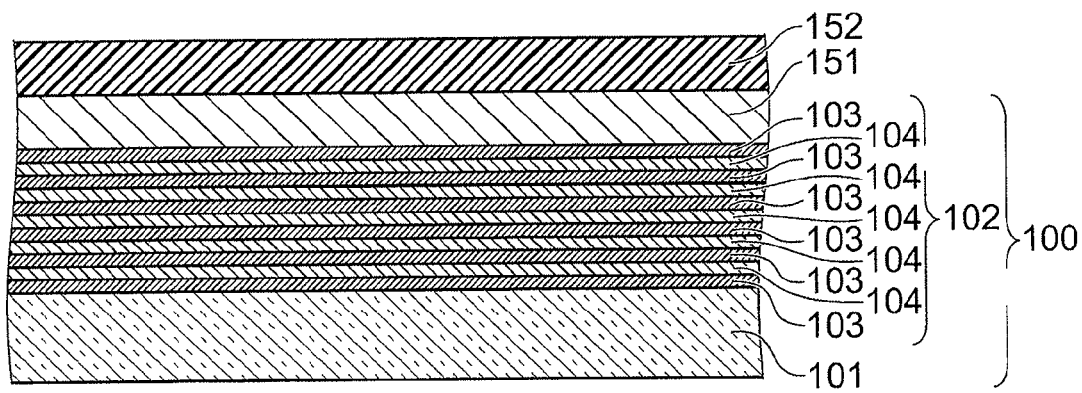
FIG. 10 is a process cross-sectional view showing the manufacturing method of the EUV mask according to the embodiment.
Figure 11:
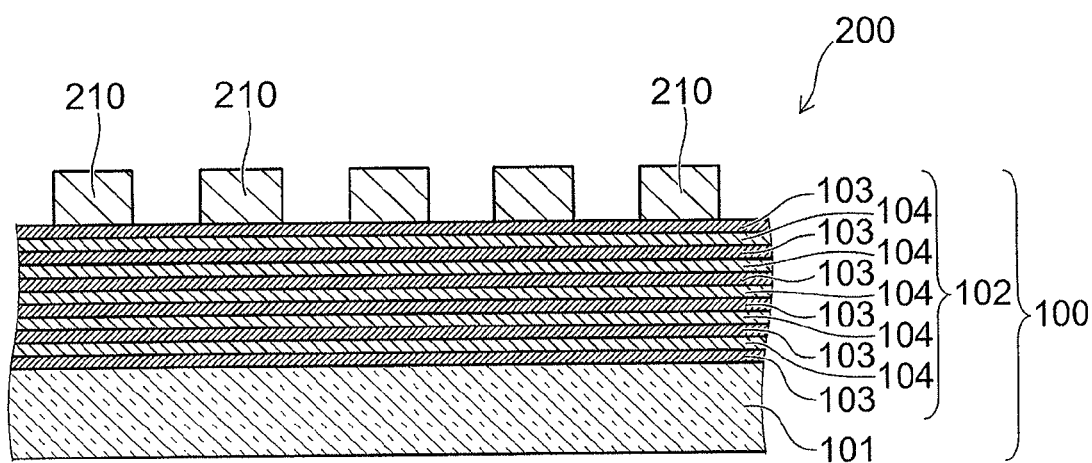
FIG. 11 is a cross-sectional view showing the EUV mask manufactured in the embodiment.

FIG. 10 is a process cross-sectional view showing the manufacturing method of the EUV mask according to the embodiment, and FIG. 11 is a cross-sectional view showing the EUV mask manufactured in the embodiment.

As illustrated in FIG. 10, first, the blank 100 determined to be "non-defective" by the acceptance determining method of the blank for EUV mask according to the embodiment is prepared. Subsequently, on the whole surface on the multilayer film 102 of this blank 100, a material which absorbs the EUV light such as tantalum (Ta), for example, is accumulated so as to form an absorption film 151. Subsequently, a resist film 152 exposed to electron beams is formed on the absorption film 151. Subsequently, by selectively exposing the resist film 152 by electron beam lithography and by development, a resist pattern is formed. Subsequently, by performing anisotropic etching using the resist pattern as a mask, the absorption film 151 is selectively removed. After that, the resist pattern is removed.

As a result, as illustrated in FIG. 11, the mask pattern 210 made of the material containing tantalum, for example, is formed on the multilayer film 102 of the blank 100. As described above, the EUV mask 200 is manufactured. In the EUV mask 200, the mask pattern 210 made of the material which absorbs the EUV light is formed on the blank 100 in which the multilayer film 102 is provided on the quartz substrate 101.

Subsequently, a manufacturing method of the integrated circuit device using this EUV mask 200 will be described.

First, the resist film (not shown) is formed on a waver (not shown) so as to be used as a material to be worked. At this time, the resist film may be in contact with the wafer, may be provided on an insulating film provided on the wafer or may be provided on a conductive film provided on the wafer. Subsequently, the material to be worked and the EUV mask 200 are set on an EUV exposing machine (not shown). Then, an EUV light source of the EUV exposing machine is made to emit the EUV light so as to irradiate the mask pattern formation region 106 (See FIG. 1) on the upper face of the EUV mask 200 with the light. At this time, the EUV light having reached the mask pattern 210 is absorbed by the mask pattern 210, while the EUV light having passed through the side of the mask pattern 210 and reached the multilayer film 102 is reflected by the multilayer film 102. As a result, the EUV light emitted to the EUV mask 200 is selectively reflected, reaches the resist film on the wafer, and forms an exposed image. As a result, the resist film is locally exposed.

After that, the material to be worked is taken out of the EUV exposing machine and developed so as to form the resist pattern. Subsequently, treatment is applied by using this resist pattern as a mask. For example, impurities are selectively implanted by using this resist pattern as a mask so as to form an impurity diffusion layer in the wafer. Alternatively, etching is performed by using this resist pattern as a mask and the insulating film or the conductive film provided on the wafer is selectively removed so as to form a contact hole, wiring or the like. As described above, the integrated circuit device 300 is manufactured. At this time, at least a part of defects contained in the blank 100 becomes a defect of the EUV mask 200, but the integrated circuit device 300 does not become defective due to the defect in the blank 100.

Subsequently, advantages of the embodiment will be described.

In the embodiment, in a process illustrated at Step S2 in FIG. 3, with regard to the blank for which presence of a defect is confirmed, it is determined in a process illustrated at Steps S3 and S4 whether or not this defect is a killer defect, and if it is not a killer defect, this blank is determined to be "non-defective" as illustrated at Step S9. Also, even if the defect in the blank is a killer defect, it is determined in a process illustrated at Steps S5 and S6 whether or not remedy is possible by shifting the formation position of the mask pattern, and if the remedy is possible, this blank is determined to be "non-defective". Moreover, in a process illustrated at Steps S7 and S8, it is determined whether or not the integrated circuit device can be remedied by using the redundancy circuit, and if the remedy is possible, this blank is determined to be "non-defective". If the EUV mask is manufactured by using the blank determined to be "non-defective" and the integrated circuit device is manufactured by using this EUV mask, the integrated circuit device does not become defective due to the defect in the blank.

As described above, according to the embodiment, even a blank containing a defect is determined as "non-defective" as long as the situation can be avoided in which the integrated circuit device to be manufactured becomes defective, and thus, the yield of the blank can be improved. As a result, a manufacturing cost of the blank can be reduced, and thus, the manufacturing cost of the EUV mask can be reduced and moreover, the manufacturing cost of the integrated circuit device can be reduced.

On the other hand, if it is determined that all the blanks in which presence of a defect is confirmed in the process illustrated at Step S2 are defective, it is difficult to manufacture a blank with no defect, and thus, the yield of the blank is lowered, and the manufacturing costs of the blank and the EUV mask increase. As a result, the cost of the integrated circuit device also increases.

In the embodiment, the example is shown in which the evaluation on whether or not the integrated circuit device becomes defective due to a defect in the blank is made by simulating the effect of the defect in the blank on the exposed image, but the invention is not limited by that. For example, this evaluation may be made on the basis of experimental data. For example, the EUV mask is actually manufactured by using a blank containing a defect, an exposed image is formed by irradiating this EUV mask with the EUV light, the effect of the defect on this exposed image is evaluated, and such experiment results are accumulated in advance. Then, it may be so configured that the effect of the defect contained in the blank to be determined on the exposed image is estimated on the basis of the accumulated experiment results and whether or not the integrated circuit device becomes defective is determined.

Also, in the embodiment, the example in which examination of the probability of remedy by shifting the formation position of the mask pattern illustrated at Steps S5 and S6 in FIG. 3 is made prior to the examination of the probability of remedy by using the redundancy circuit illustrated at Steps S7 and S8 is shown, but the invention is not limited by that, and the order of these examinations may be vice versa. Also, only one of these examinations may be made. Moreover, in addition to these examinations or instead of these examinations, a probability of remedy by other means may be examined and if the remedy is possible, the blank may be determined to be "non-defective" Furthermore, the examination of the probability of remedy by shifting the formation position of the mask pattern and the examination of the probability of remedy by using the redundancy circuit do not have to be made. The yield of the blank can be also improved, as compared with the determination of all the blanks containing a defect to be "defective", by determining at least presence of a killer defect as illustrated at Steps S3 and S4, by determining that the blank is "non-defective" if there is no killer defect, and by determining the blank to be "defective" if there is a killer defect.

According to the above-described embodiment, the acceptance determining method of a blank for EUV mask and the manufacturing method of the EUV mask in which the manufacturing cost can be reduced can be realized.

While certain embodiments have been described, these embodiments have been presented by way of example only, and are not intended to limit the scope of the inventions. Indeed, the novel embodiments described herein may be embodied in a variety of other forms, furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An acceptance determining method of a blank for an extreme ultraviolet (EUV) mask comprising:
   evaluating, by using a computer, whether an integrated circuit device becomes defective, on the basis of information of a defect contained in a blank for an EUV mask and design information of a mask pattern to be formed on the blank, the integrated circuit device being to be manufactured by using the EUV mask, the EUV mask being manufactured by forming the mask pattern on the blank, the evaluating including:
      determining whether a position to which the defect is to be transferred in the integrated circuit device is within a region where remedy is possible by a redundancy circuit of the integrated circuit device; and
      determining whether the number of the defects to be transferred into the region is not more than the number capable of remedy by the redundancy circuit,
   it being determined that the device to be defective can be remedied in a case that the position to which the defect is to be transferred is within the region and the number of the defects is not more than the number capable of remedy,
   the blank being determined to be non-defective in a case that the integrated circuit device is not to be defective or in a case that the integrated circuit device to be defective can be remedied.

2. The method according to claim 1, wherein
the integrated circuit device is a memory device including a memory cell region and a peripheral circuit region, and
the region where remedy is possible contains the memory cell region.

3. The method according to claim 1, wherein
the evaluating includes determining whether the integrated circuit device becomes non-defective by shifting a formation position of the mask pattern with respect to the blank,
the blank is determined to be non-defective in a case that the integrated circuit device becomes non-defective by shifting the formation position.

4. The method according to claim 1, wherein
the evaluating includes simulating of effect of the defect on an exposed image obtained by irradiating the EUV mask with EUV light on the basis of the design information, a layer structure of the EUV mask, and exposure conditions.

5. The method according to claim 1, wherein
the evaluating includes estimating of effect of the defect contained in the blank on an exposed image on the basis of an experiment result of evaluation of effect of a defect contained in the EUV mask on the exposed image obtained by irradiating the EUV mask with EUV light.

6. The method according to claim 1, wherein
the blank has a multilayer film formed on a substrate, and
the defect includes a phase defect in which phase of the multilayer film is locally shifted.

7. The method according to claim 1, wherein
the defect includes a pattern disturbing defect which generates a non-transparent defect shutting out EUV light when the mask pattern is formed on the blank.

8. The method according to claim 1, wherein
the defect includes a pattern disturbing defect which generates a transparent defect transmitting EUV light when the mask pattern is formed on the blank.

9. A manufacturing method of an extreme ultraviolet (EUV) mask, comprising:
   forming a mask pattern on a blank for an EUV mask,
   the blank having been determined, by using a computer, to be non-defective according to a determination result that an integrated circuit device does not become defective, on the basis of information of a defect contained in the blank and design information of the mask pattern, the integrated circuit device being to be manufactured by using an EUV mask, the EUV mask being manufactured by forming the mask pattern on the blank, wherein the blank having been determined to be non-defective according to a determination result that the integrated circuit device to be defective can be remedied by using a redundancy circuit of the integrated circuit device, a position to which the defect is to be transferred in the integrated circuit device being within a region where remedy is possible by the redundancy circuit, and the number of the defects to be transferred into the region being evaluated to be not more than the number capable of remedy by the redundancy circuit.

10. The method according to claim 9, wherein
the integrated circuit device is a memory device including a memory cell region and a peripheral circuit region, and
the region where remedy is possible contains the memory cell region.

11. The method according to claim 9, wherein
the blank has been determined as a result of the integrated circuit device becoming non-defective by shifting a formation position of the mask pattern with respect to the blank.

12. The method according to claim 9, wherein
in evaluation on whether the integrated circuit device becomes defective, effect of the defect on an exposed image obtained by irradiating the EUV mask with EUV light is simulated on the basis of the design information, a layer structure of the EUV mask and exposure conditions.

13. The method according to claim 9, wherein in evaluation on whether the integrated circuit device becomes defective, effect of the defect contained in the blank on an exposed image is estimated on the basis of an experiment result of evaluation on effect of a defect contained in the EUV mask on the exposed image obtained by irradiating the EUV mask with EUV light.

14. The method according to claim 9, wherein
the blank has a multilayer film formed on a substrate, and
the defect includes a phase defect in which phase of the multilayer film is locally shifted.

15. The method according to claim 9, wherein
the defect includes a pattern disturbing defect which generates a non-transparent defect shutting out EUV light when the mask pattern is formed on the blank.

16. The method according to claim 9, wherein
the defect includes a pattern disturbing defect which generates a transparent defect transmitting EUV light when the mask pattern is formed on the blank.

* * * * *